Oct. 13, 1959 W. R. HARTER 2,908,869

STABLE OSCILLATOR

Filed Jan. 3, 1958 2 Sheets-Sheet 1

INVENTOR.
WILLIAM R. HARTER.
BY Alden D. Redfield
Charles M. Hogan
ATTORNEYS.

INVENTOR.
WILLIAM R. HARTER.
BY Alden D. Redfield
Charles M. Hogan
ATTORNEYS.

United States Patent Office 2,908,869

Patented Oct. 13, 1959

2,908,869

STABLE OSCILLATOR

William R. Harter, Cincinnati, Ohio, assignor to Avco Manufacturing Corporation, Cincinnati, Ohio, a corporation of Delaware Application January 3, 1958, Serial No. 707,062

3 Claims. (Cl. 331—72)

The present invention relates generally to very high frequency oscillators, and it provides specifically a tunable oscillator having particularly desirable frequency stability characteristics.

A characteristic difficulty with basic vacuum tube and transistor oscillator circuits is frequency instability. It has long been known to the art that replacement of circuit elements and small variations in internal and external operating parameters such as temperature, bias, and power supply voltages result in substantial output frequency and output voltage variations.

Rigorous frequency stability requirements have heretofore caused the art to adopt complex circuitry generally involving piezo-electric crystals and reference devices of such character. Circuitry exploiting such reference devices is relatively complex and expensive. There has classically been a need for a tunable oscillator, of very high frequency stability and output voltage constancy, which dispenses with and is not premised upon crystal circuitry.

The present invention is directed to this requirement, and the principal object of the invention is to provide novel oscillator circuitry which, in combination with known mechanical supporting structure and the exploitation of the most advanced known mechanical techniques, achieves exceptional frequency stability. The stability of the oscillator herein shown, even though the oscillator is variable and tunable over a wide frequency range, approaches that of a fixed-tuned crystal-controlled circuit. Throughout this range the invention produces stable output power.

Another object of the invention is to provide an electron-coupled, variable-inductance tuned oscillator circuit which incorporates stabilizing parameters of an order of magnitude sufficient to swamp out undesired variations in operating parameters. A subordinate object of the invention is to provide an oscillator characterized by a high tank circuit Q and a low $L/C$ ratio.

A typical embodiment of the invention, utilizing the illustrative parameters hereinafter mentioned, was tuned with precision through a frequency range from 32.2 to 57.5 megacycles and, by rigorous measurements, found to have a frequency stability from 0.02 to 0.05% through a temperature range from −40° to +60° centigrade.

The frequency stability of the oscillator provided by this invention is in some measure due to its exploitation of a basic Colpitts circuit in combination with certain significant departures, including:

(1) The provision of a glass-bonded mica insulating base having the principal tuning inductance printed on one side and the remaining tank circuit inductances mounted on the other side;

(2) The provision, in the general basic grounded plate type Colpitts oscillator, of a trifilar winding mounted on such base, one of the coils of the winding being used as the choke between the oscillator tube cathode and ground, and the other two windings being severally connected in circuit with the heater leads.

A further object of the invention is to provide an oscillator of the general character described, which departs from the prior art in the sense that the lead inductance between oscillator plate and ground is so proportioned, in combination with the series capacitance in that circuit, as to provide a plate-to-grid coupling which is capacitive throughout the tuning range of the oscillator but which approaches zero impedance on the low frequency side and attains higher impedance values as the oscillator is tuned to higher frequencies, thereby automatically to stabilize the frequency by providing less feedback through the plate-to-grid capacitance at low frequencies and relatively greater feedback through the plate-to-grid capacitance at higher frequencies.

Another object of the invention is to enhance frequency stability of a tunable oscillator of the general character described by so proportioning the lead inductance, between cathode and the capacity voltage-dividing tap, and the radio frequency choke that these two circuit elements, in conjunction with the effectively parallel resistive and capacitive parameters of the grid-to-cathode circuit of the tube, "look like" a capacitor throughout the tuning range and constitute effectively a fixed impedance between grid and ground.

For a better understanding of the present invention, together with other and further objects, advantages, and capabilities thereof, reference is made to the following description of the appended drawings, in which.

Figure 6:
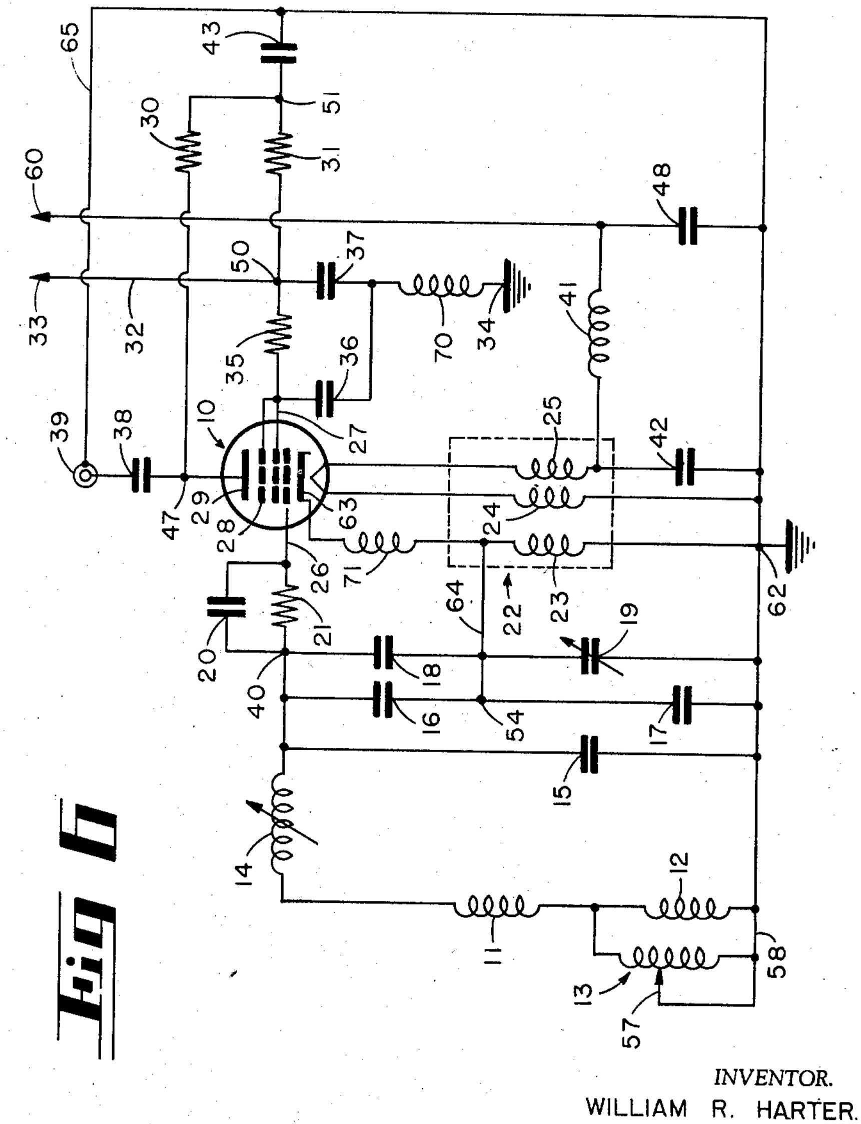
Fig. 6 is a circuit schematic of the novel oscillator circuit in accordance with the invention.

Referring first specifically to Fig. 6, it will be seen that the novel oscillator circuit there shown, in common with many oscillator circuits, is generically of the Colpitts type. However, the oscillator of the present invention departs from the basic Colpitts circuit in substantial and material respects which enhance high frequency stability and are described and claimed herein.

Parenthetically, reference is made to the following publications for descriptive material relating to the basic Colpitts type circuit:

Terman "Electronic and Radio Engineering," pages 489–490, McGraw-Hill Book Company, Inc., New York, 1955;

Batcher and Moulic, "The Electronic Engineering Handbook," page 233, Electronic Development Associates, New York, 1944;

Terman "Radio Engineers' Handbook," pages 480–481, McGraw-Hill, New York, 1943;

Reich "Theory and Application of Electron Tubes," pages 391–392, McGraw-Hill, New York, 1944.

Referring again to Fig. 6, there is shown a pentode oscillator tube 10 (encased in a cap 9, best shown in Fig. 2) in combination with inductive tank circuit elements 11, 12, 13, and 14, capacitive tank circuit elements 15, 16, 17, 18, and 19, and series grid leak and condenser elements 21 and 20, respectively. The frequency determining elements perform the usual function of the basic Colpitts oscillator tank.

The tank circuit comprises an inductive branch consisting of serially arranged elements 14, 11 and 12, 12 being paralleled by element 13, and a capacitive branch which consists of three parallel sub-branches—one comprising capacitor 15, the second comprising capacitors 16 and 17 in series, and the third comprising capacitors 18 and 19 in series. The tank circuit is coupled to control grid 26 of pentode tube 10 via the combination of grid leak 21 and capacitor 20. The plate function of this oscillator is performed by the second and third grids, here numbered 27 and 28, conductively connected together, and hereinafter collectively referred to as the "oscillator plate." The low potential terminal of the tank circuit is connected to ground at 62, and the oscillator plate coupling to the tank circuit is completed by capacitor 36 and the lead inductance between capacitor 36 and ground, here symbolically illustrated as a lumped inductance 70. Voltage division for feedback purposes is accomplished by connecting the junction or tap point 54 of capacitances 16, 17, 18, and 19 to cathode 63 by conductor 64. The advantages of electron coupling to the load are achieved in this oscillator by coupling the anode 29 of tube 10, via capacitor 38, to output connector 39. This connector is suitably shielded and the shield is connected to ground by conductor 65.

In accordance with one feature of the invention, the feedback circuit comprising capacitor 36 and the lead between such capacitor and ground, here shown as its electrical equivalent in the form of a lumped inductance parameter 70, is proportioned in a novel way—that is to say, the elements 36 and 70 comprise a circuit which is capacitive throughout the tuning range of the oscillator. This circuit approaches zero impedance at the low frequency side of the tuning range, thereby to reduce the feedback through the plate-to-grid capacitance of tube 10. Conversely, this network increases in impedance value as the oscillator is tuned through higher frequencies, thereby to increase feedback through the plate-to-grid capacitance. Frequency and oscillator output power are stabilized by this automatic control of feedback. As the feedback through the plate-to-grid capacitance is increased or decreased, the feedback effected by the capacity voltage dividing action which is characteristic of Colpitts oscillators is decreased or increased. That is to say, the automatic operation of the circuit elements 36 and 70 is such as effectively to shift the tap point 54, rendering such point equivalent to a variable tap on a capacitance voltage divider.

Oscillator plate voltage is supplied to the elements 27 and 28 from a suitable source of voltage (not shown), the positive terminal 33 of which is connected to the oscillator plate through a suitable filter comprising series resistor 35 and shunt capacitors 36 and 37. Anode voltage is supplied to anode 29 from terminal 33 via series dropping resistors 31 and 30, the junction 51 of which is shunted to ground by filter capacitor 43.

Heater voltage is supplied from terminal 60 via a filter comprising series choke 41 and shunt capacitances 42 and 48.

Cathode 63 is isolated from ground by a choke comprising coil 23 of trifilar winding 22. The remaining coils 24 and 25 are individually connected in series with the heater leads, 24 being connected between one heater lead and ground, and 25 being connected between the other heater lead and the junction of heater supply choke 41 and filter condenser 42. Thus the R.F. potential of the heater is equated to that of the cathode to eliminate undesired capacitance effects between cathode and heater.

According to another feature of the present invention, the radio frequency choke 23 and the lead inductance between cathode and the voltage dividing tap point 54, 64, which lead inductance is here symbolically illustrated by an equivalent lumped inductive parameter 71 (Fig. 6), are so proportioned that they, in conjunction with the effectively parallel cathode-to-grid capacitance and resistance parameters, "look like" a capacitor between grid 26 and ground 62, throughout the tuning range, said capacitor being of effectively fixed impedance. That is to say, as the effective capacitive reactance provided by choke 23 and its inherent capacitance varies with frequency in one direction, the effective capacitive impedance of the circuit elements between grid 26 and tap point 54, 64 varies in compensatory opposing fashion.

Figures 1, 2, 3, 4, 5:
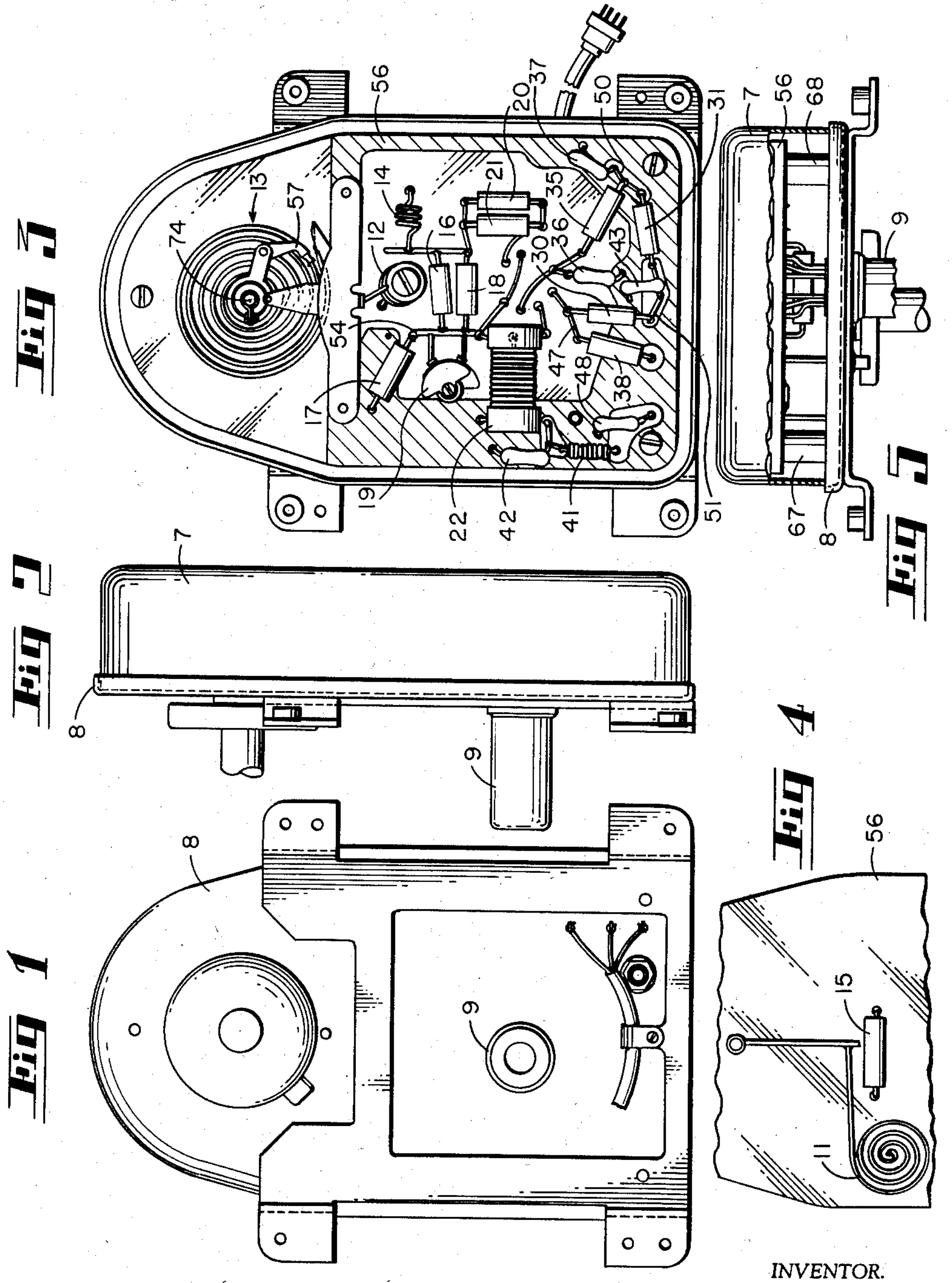
Fig. 1 is a front elevational view of the mechanical supporting structure or mounting which is utilized in the present invention.
Fig. 2 is a side elevational view of such structure.
Fig. 3 is a rear elevational view of the entire oscillator unit showing the components supported thereon as the oscillator appears when the shielding can is removed.
Fig. 4 is a fragmentary view of the front side of the molded glass-bonded mica base.
Fig. 5 is a view of the under side of the oscillator structure with certain parts, such as the shielding can and the vacuum tube housing, partially broken away.

As best illustrated in Fig. 3, the tank circuit capacitive elements 16, 17, 18, and 19 are mounted on and secured to the rear side of a temperature-stable, glass-bonded mica base 56. The principal tuning inductance element 11 is printed on the front side of such base (Fig. 4), and the remaining tank circuit capacitance 15 is mounted on the same side in proximity to inductance 11. All of the tank circuit capacitive elements are fixed with the exception of variable, rotary plate type capacitor 19, which is utilized to provide for factory adjustment.

Printed circuitry is utilized generally in the interconnection of components, and in this respect the mounting of the following components is, as shown in Fig. 3, conventional: grid leak and capacitor elements 21 and 20; output coupling capacitor 38; anode dropping resistors 30 and 31; anode voltage filter capacitor 43; oscillator plate voltage filter elements 35, 36, and 37; and heater filter elements 41, 42, and 48. The last-mentioned list of elements is shown in its entirety, mounted on the rear side of base 56 (Fig. 3).

Tube 10, projecting from the front side of plate 8, is protected by a suitable cap 9 and mounted on a socket secured to metallic plate 8, which serves as a closure member for a metallic housing or can 7. The base 56 is rigidly secured to and suitably spaced from the metallic plate 8 by rigid supporting members 67 and 68.

In accordance with one phase of the invention which makes for enhanced frequency stability, one inductive portion 11 of the tank circuit is printed as a conductive spiral on the front of the base 56 (Fig. 4), while the remaining inductive elements are located on the back of such base, as will be seen by reference to Fig. 3. The end inductance 14 is a screw-driver adjusted helix, and the inductive element 12 is a magnetic slug-tuned vertically mounted solenoid. The inductive element 13 is a variably short-circuited winding described in detail in numerous publications, including U.S. Patent 2,694,150 to Bussard and U.S. Patent 2,666,906 to Aust. Reference is made to the foregoing patents for a description of the details of such variably short-circuited winding. The short-circuiting is accomplished by a manually controlled shaft 74, manipulation of which accomplishes variable short-circuiting of the inductance 13 and tuning of the oscillator through its operating range.

Frequency stability of the present oscillator is greatly enhanced because of the provision of the trifilar winding 22 containing coils 23, 24, and 25, previously described. As illustrated in Fig. 3, winding 22 is positioned on the rear side of the base 56 and supported thereby.

The following illustrative parameters have been found to be suitable in one practical embodiment of the invention:

| Capacitors: | Micromicrofarads |
|---|---|
| 15 | 12 |
| 16 | 12 |
| 17 | 27 |
| 18 | 15 |
| 19 (Variable) | 1–5 |
| 20 | 15 |
| 36 | 500 |
| 37 | 500 |
| 38 | 18 |
| 42 | 500 |
| 43 | 500 |
| 48 | 500 |

| Inductors: | Microhenries |
|---|---|
| 11 and 14 together | 0.19 |
| 12 | 1.52 |
| 13 | 0.025–0.713 |
| 41 | 1.0 |
| Trifilar winding 22 | 3 wires, 27 turns, wound on ⅜ inch diameter bobbin, 3/34 Litz wire, approximately 7 twists per inch. |

| Resistors: | Ohms |
|---|---|
| 21 | 100,000 |
| 30 | 3300 |
| 31 | 1000 |
| 35 | 1000 |

| Tube: | Type |
|---|---|
| 10 | 5636 |

| Voltage: | Volts |
|---|---|
| Anode supply at source | 105 |

While there has been shown and described what is at present considered to be the preferred embodiment of the invention, it will be understood by those skilled in the art that various modifications and changes and substitutions of equivalents may be made therein without departing from the scope of the invention as defined by the appended claims.

I claim:

1. A stable tunable oscillator comprising, in combination, a tank circuit having a variable inductance branch and a capacitance-dividing branch provided with three terminals, a pentode tube having a heater provided with terminals and at least cathode and control grid and screen grid and anode electrodes, a self-biasing network for said control grid, a load coupled to said anode, said screen grid functioning as the oscillator plate and the load being electron coupled to the oscillator elements of the tube, a radio frequency choke connected between said cathode and a point of reference potential, radio frequency chokes between the heater terminals and said point of reference potential, the three terminals of the capacitance-dividing branch being individually connected to the grid bias network and to the cathode and to said point of reference potential, and a series combination of capacitance and inductance connected between said oscillator plate and said point of reference potential, said combination being proportioned to provide an oscillator plate-to-grid coupling which is capacitive throughout the tuning range of the oscillator but which approaches zero impedance on the low frequency side of such range and attains higher impedance values as the oscillator is tuned to higher frequencies, thereby automatically to stabilize the frequency by providing relatively less feedback through the plate-to-grid capacitance at low frequencies and relatively greater feedback through the plate-to-grid capacitance at higher frequencies, the feedback applied from the capacitance-dividing branch decreasing or increasing, respectively, as the first-mentioned feedback increases or decreases.

2. A stable tunable oscillator comprising, in combination, a tank circuit having a variable inductance branch and a capacitance-dividing branch provided with three terminals, a pentode tube having a heater provided with terminals and at least cathode and control grid and screen grid and anode electrodes, a self-biasing network for said control grid, a load coupled to said anode, said screen grid functioning as the oscillator plate and the load being electron coupled to the oscillator elements of the tube, a radio frequency choke connected between said cathode and a point of reference potential, radio frequency chokes between the heater terminals and said point of reference potential, the three terminals of the capacitance-dividing branch being individually connected to the grid bias network and to the cathode and to said point of reference potential, and a capacitance and inductance connected between said oscillator plate and said point of reference potential, the radio frequency choke and the lead inductance between said cathode and its associated terminal on the capacitance-dividing branch being so proportioned that they, in conjunction with the effectively parallel cathode-to-grid capacitance and resistance parameters, "look like" a capacitor between grid and said point of reference potential throughout the tuning range, said capacitor being of effectively fixed impedance in that as the effective capacitive reactance provided by the choke and its inherent capacitance varies with frequency in one direction, the effective capacitive impedance of the circuit parameters between the grid and such terminal varies in compensatory opposing fashion.

3. A stable tunable oscillator comprising, in combination, a tank circuit having a variable inductance branch and a capacitance-dividing branch provided with three terminals, a pentode tube having a heater provided with terminals and at least cathode and control grid and screen grid and anode electrodes, a self-biasing network for said control grid, a load coupled to said anode, said screen grid functioning as the oscillator plate and the load being electron coupled to the oscillator elements of the tube, a radio frequency choke connected between said cathode and a point of reference potential, radio frequency chokes between the heater terminals and said point of reference potential, the three terminals of the capacitance-dividing branch being individually connected to the grid bias network and to the cathode and to said point of reference potential, and a series combination of capacitance and inductance connected between said oscillator plate and said point of reference potential, said combination being proportioned to provide an oscillator plate-to-grid coupling which is capacitive throughout the tuning range of the oscillator but which approaches zero impedance on the low frequency side of such range and attains higher impedance values as the oscillator is tuned to higher frequencies, thereby automatically to stabilize the frequency by providing relatively less feedback through the plate-to-grid capacitance at low frequencies and relatively greater feedback through the plate-to-grid capacitance at higher frequencies, the feedback applied by the capacitance-dividing branch decreasing or increasing, respectively, as the first-mentioned feedback increases or decreases, the radio frequency choke and the lead inductance between said cathode and its associated terminal on the capacitance-dividing branch being so proportioned that they, in conjunction with the effectively parallel cathode-to-grid capacitance and resistance parameters, "look like" a capacitor between grid and said point of reference potential throughout the tuning range, said capacitor being of effectively fixed impedance in that as the effective capacitive reactance provided by the choke and its inherent capacitance varies with frequency in one direction, the effective capacitive impedance of the circuit parameters between the grid and such terminal varies in compensatory opposing fashion.

References Cited in the file of this patent

UNITED STATES PATENTS

| | | |
|---|---|---|
| 1,942,385 | Piety | Jan. 2, 1934 |
| 1,959,156 | Downey | May 15, 1934 |
| 1,962,104 | Harnett | June 5, 1934 |
| 1,996,847 | Zimmerman et al. | Apr. 9, 1935 |
| 2,440,308 | Storck | Apr. 27, 1948 |
| 2,663,799 | Bell | Dec. 22, 1953 |
| 2,686,879 | Pan et al. | Aug. 17, 1954 |